United States Patent [19]

Zemek et al.

[11] 4,151,637
[45] May 1, 1979

[54] DIP COMPONENT LEAD CUT AND CLINCH APPARATUS

[75] Inventors: Albert W. Zemek, Binghamton, N.Y.; Crawford A. Matson, Wyalusing, Pa.

[73] Assignee: Universal Instruments Corporation, Binghamton, N.Y.

[21] Appl. No.: 875,855

[22] Filed: Feb. 7, 1978

[51] Int. Cl.² ............................ B21F 1/00; B21F 11/00
[52] U.S. Cl. ................................. 29/566.1; 29/33 M; 29/715; 140/105
[58] Field of Search ................... 29/566.3, 566.1, 714, 29/715, 741, 33 F, 33 M, 564.8; 140/105, 93 D; 227/79

[56] References Cited

U.S. PATENT DOCUMENTS

| 3,034,382 | 5/1962 | Hazel ........................... 29/564.8 X |
| 3,141,492 | 7/1964 | Petree et al. .................. 29/564.8 X |
| 3,414,024 | 12/1968 | Anderson et al. ............... 29/741 X |
| 3,429,170 | 2/1969 | Romeo .......................... 29/566.3 X |
| 3,550,238 | 12/1970 | Allen et al. .................... 29/741 X |
| 3,986,533 | 10/1976 | Woodman, Jr. .................. 140/105 |
| 4,087,034 | 5/1978 | Kikkawa et al. ............... 29/566.1 X |

Primary Examiner—Horace M. Culver
Attorney, Agent, or Firm—Fidelman, Wolffe & Waldron

[57] ABSTRACT

An apparatus for simultaneously cutting and clinching both parallel rows of leads of DIP type electronic components. The apparatus operating adjacent the undersurface of a printed circuit board into which component leads have been inserted includes a cutter capable of clinching the lead rows either inward toward each other or outward.

7 Claims, 21 Drawing Figures

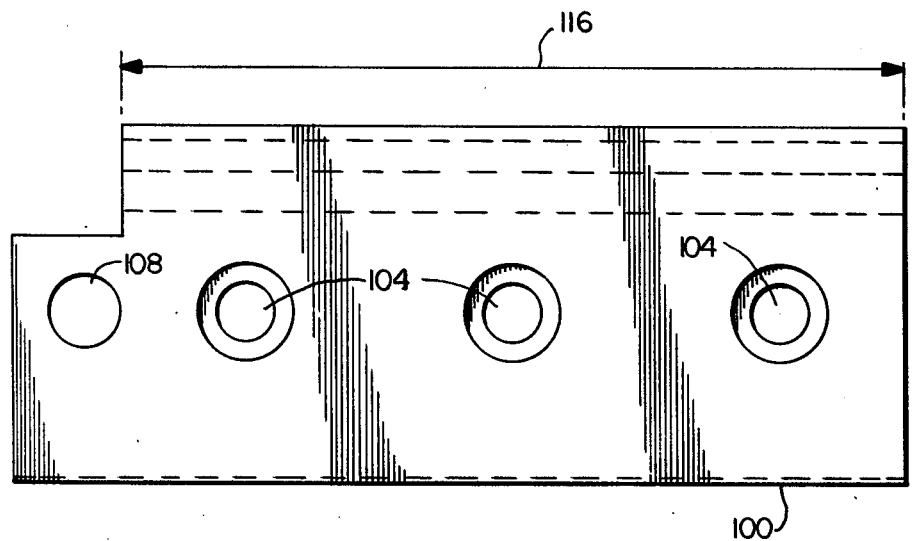
FIG. 8a
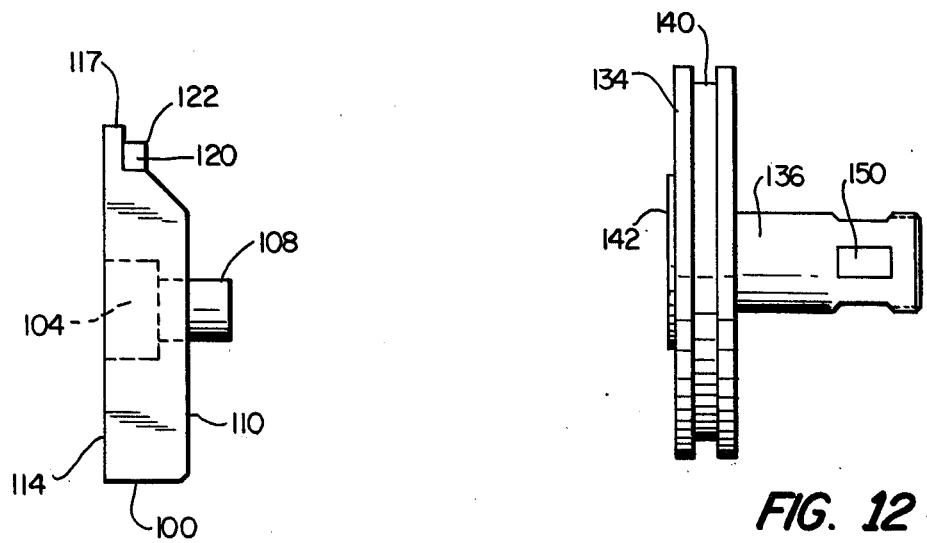
FIG. 8b
FIG. 12
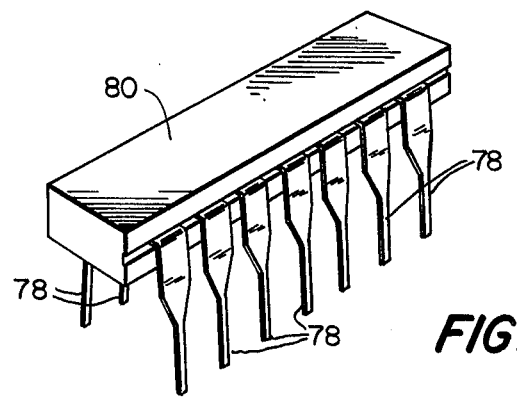
FIG. 13

DIP COMPONENT LEAD CUT AND CLINCH APPARATUS

BACKGROUND OF THE INVENTION

In the field of electronic component assembly and insertion, a major step in inserting components into predrilled holes in printed circuit boards is cutting the leads to length after insertion, and clinching the remaining leads underneath the circuit board.

In the past, numerous devices have been designed to accomplish the cutting function. There are devices for cutting single leads, and devices for cutting two leads at a time using two identical cutting devices in coordinated operation. The mechanism disclosed in U.S. Pat. No. 3,646,659 is an example of the latter case.

With the increasing usage of electronic modules having a large plurality of leads aligned in a single or double row, cut and clinch devices have been developed to operate simultaneously on an entire row of leads. The pending U.S. application, Multiple Lead Cut and Clinch Mechanism, Ser. No. 773,347, filed Mar. 1, 1977 by Ragard and Matson, discloses a mechanism using two cutters which in combination concurrently cut a single row of component leads numbering sixteen.

However there is an everincreasing use of prepackaged DIP type modules, having dual in line rows of prong leads extended from both sides of a generally rectangular component body. Components with as many as forty leads are quite common. Machines have already been developed for the automatic insertion of DIP components in predrilled holes in printed circuit boards. For economy and efficiency in operation what is needed is a cut and clinch apparatus which operates simultaneously on all leads in both rows on DIP components.

SUMMARY OF THE INVENTION

The DIP lead cut and clinch apparatus of this invention is comprised of a pair of opposed cutters constrained within covers allowing linear translation of the cutters. A pair of anvils are spaced apart from the covers and cutters, and leads on a DIP component inserted through predrilled holes in a printed circuit board are received therebetween. Each anvil and covered cutter operates on a single row of leads. When the opposed cutters translate toward each other the leads are driven by the cutters against hardened edges of the anvils whereby the leads are sheared to length. Continued motion of the cutters bends the leads and clinches the lead stubs against the underside of the printed circuit board. The opposed inward sweep of the cutters clinches all leads inwardly toward the opposing row of leads.

In an alternative usage, the DIP component leads are inserted through slots in the cutters adjacent to the cutter edges. The opposed cutters are translated apart to shear the leads against the cutter covers and to bend and clinch the lead stubs against the underside of the printed circuit board. The outward sweep of the opposed cutters clinches all leads away from the opposing row of leads.

The same cutter serves for both inward and outward clinching without modification. The translated position of the cutters relative to the anvils at the time of insertion of the DIP leads into the cut and clinch apparatus is determinative of the mode of operation.

The cut and clinch apparatus moves upward vertically to engage the leads prior to cutting, and vertically downward after cutting and clinching is completed on a DIP component. Rotation of the cut and clinch apparatus about a vertical axis is provided to accommodate various orientations in placement of components on the printed circuit board.

Accordingly, it is an object of this invention to provide a DIP component lead cut and clinch apparatus which is capable of simultaneously severing two rows of aligned leads.

It is a further object of this invention to provide a DIP component lead cut and clinch apparatus which is capable of clinching leads either inwardly or outwardly.

Yet another object of this invention is to provide a DIP component lead cut and clinch apparatus which clinches inwardly or outwardly without modification.

Still another object of this invention is to provide a DIP component cut and clinch apparatus which is of modularized construction.

These and other objects, advantages, and novel features of the present invention will become apparent from the following detailed description of the invention when considered in conjunction with the accompanying drawing in which.

Figure 1:
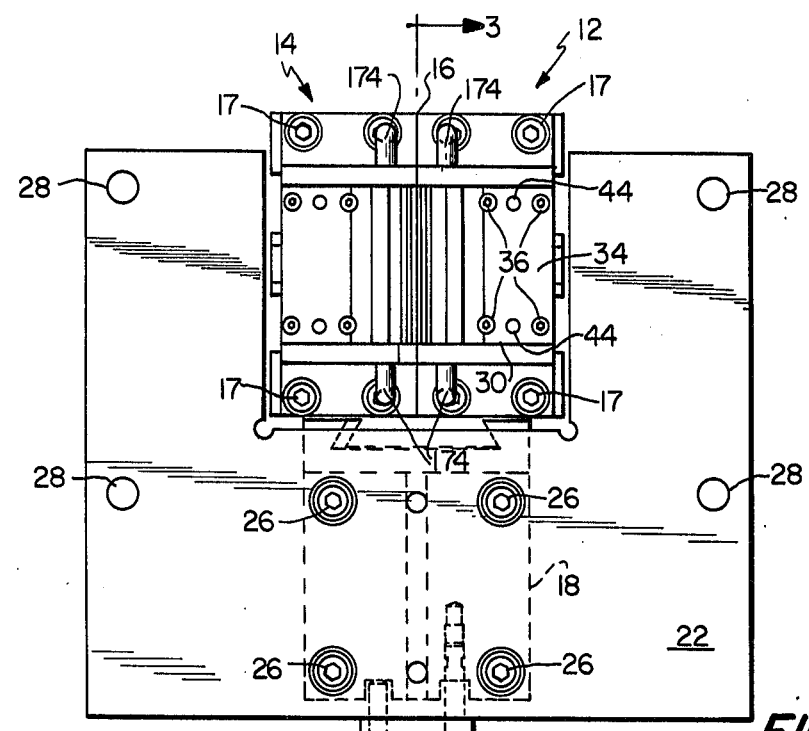
FIG. 1 is a top view of the DIP component lead cut and clinch apparatus of this invention.
Figure 6B:
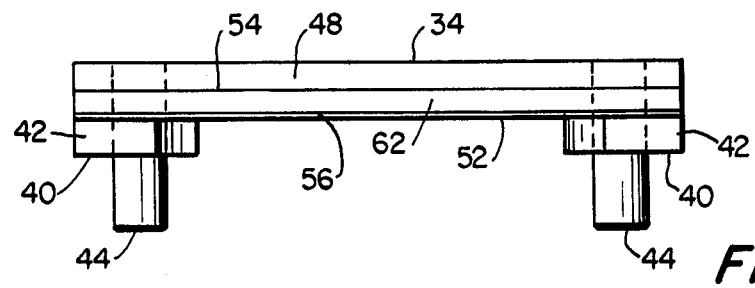
Figure 6A:
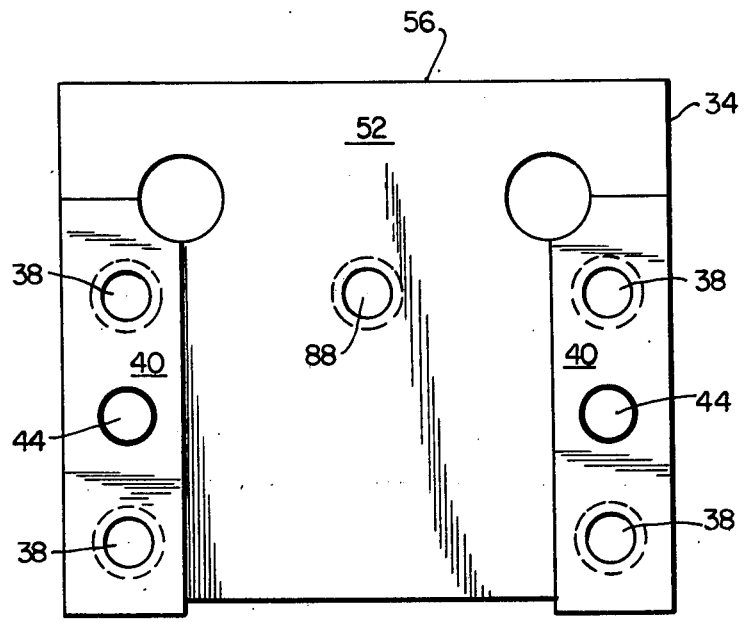
Figure 6C:
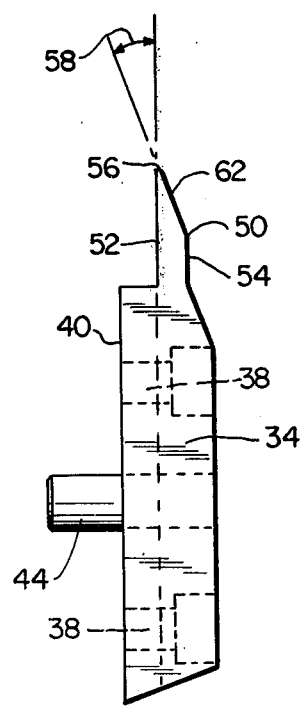

FIGS. 6 a, b, c are the front, top and side views respectively to an enlarged scale of the cover of the apparatus of FIG. 1.

Figure 7B:
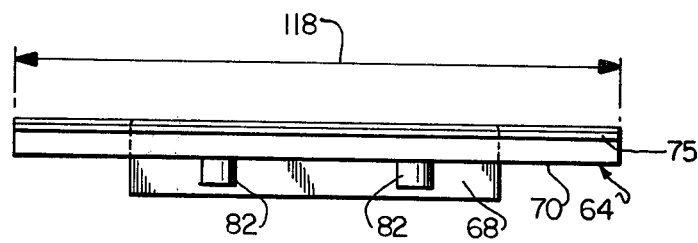
Figure 7A:
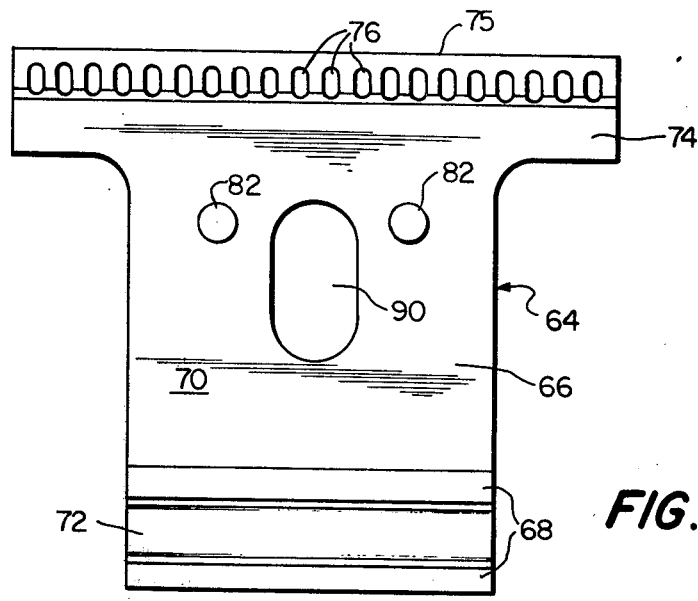

FIGS. 7 a, b, c are the front, top and side views respectively to an enlarged scale of the cutter of the apparatus of FIG. 1.

FIGS. 8 a, b are the front and side views to an enlarged scale respectively of the anvil assembly.

FIGS. 9 a, b illustrate the cutter action in forming outward cuts and clinches.

FIGS. 10 a, b, c illustrate the cutter action in forming inward cuts and clinches.

Figure 11:
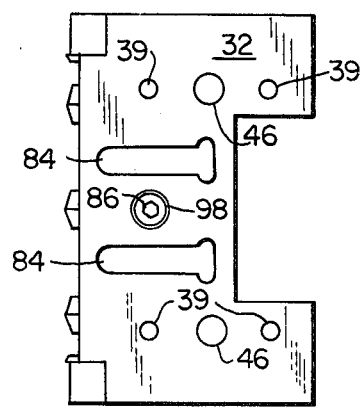
Figure 4:
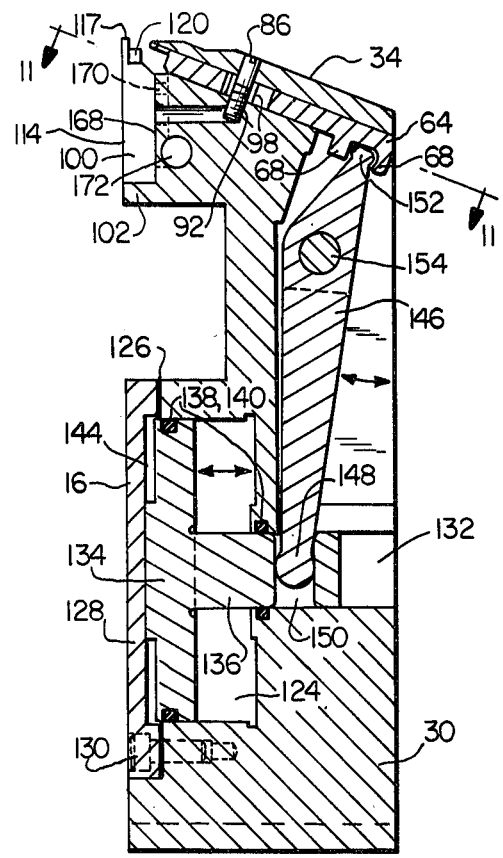
FIG. 4 is a sectional side view taken along the line 4—4 of FIG. 3.
Figure 5:
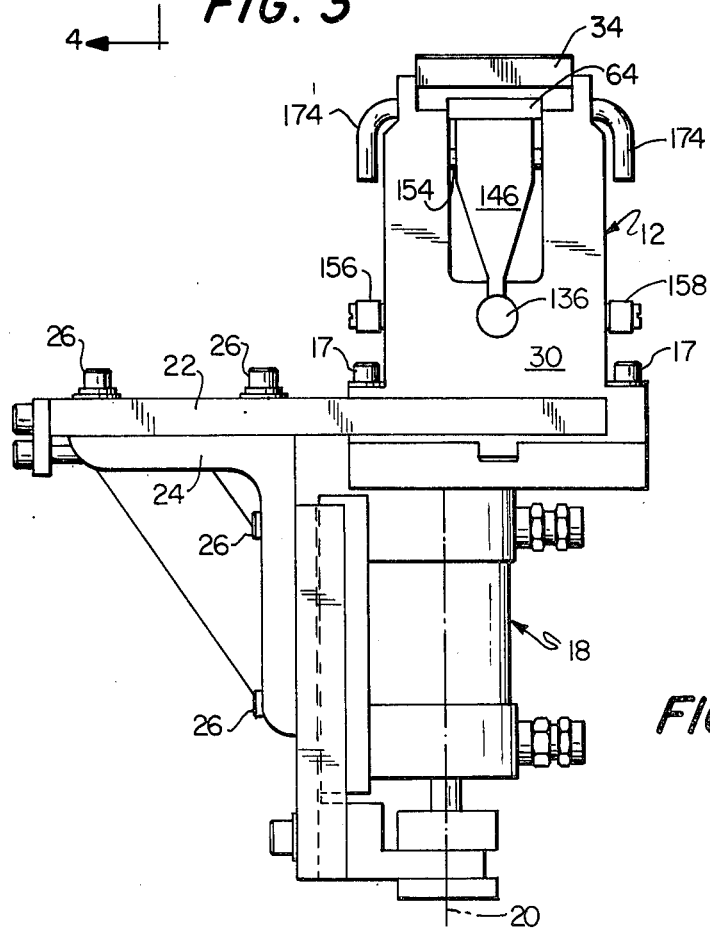
FIG. 5 is right side view of the apparatus of FIG. 1 and a back view of the module of FIG. 3.

FIG. 11 is a view taken along the line 11—11 of FIG. 4.

FIG. 12 is a top view to an enlarged scale of the piston seen in FIG. 4.

FIG. 13 is a perspective view to an enlarged scale of a DIP component.

With reference especially to FIGS. 1, 2, 3, and 5, the DIP component lead cut and clinch apparatus 10 of this invention is comprised of a pair of opposed cut and clinch modules 12, 14. The cut and clinch modules 12, 14 are identical (FIG. 2) and generally symetrical in side view (FIGS. 3, 5) and abut opposedly substantially along a vertical common interface plane 16. The cut and clinch modules 12, 14 are integrally joined by bolts 17 to a positioning assembly 18 for elevating and lowering the cut and clinch modules 12, 14 and for rotating the modules about a vertical axis 20 as will be discussed briefly hereinafter. The positioning assembly 18 is in turn integrally connected to a horizontal mounting plate 22 by means of the angle bracket 24 and bolts 26. Accordingly, the mounting plate 22 including the cut and clinch apparatus 10 and positioning assembly 18 may, for example, be supported on, or affixed to, for manual operation, a work surface 27 using bolts (not shown) passing through the mounting holes 28 in the mounting plate 22 or the assemblage 10, 18, 22 may be incorporated into an automatic machine (not shown). The automatic machine may further include devices under computer control for selecting DIP components 80 (FIG. 13) from storage and inserting the components leads 78 into predrilled holes in a printed circuit board 160. After insertion or substantially concurrently, the DIP component lead cut and clinch apparatus 10 of this invention operates on the component 80 as described hereinafter.

Figure 2:
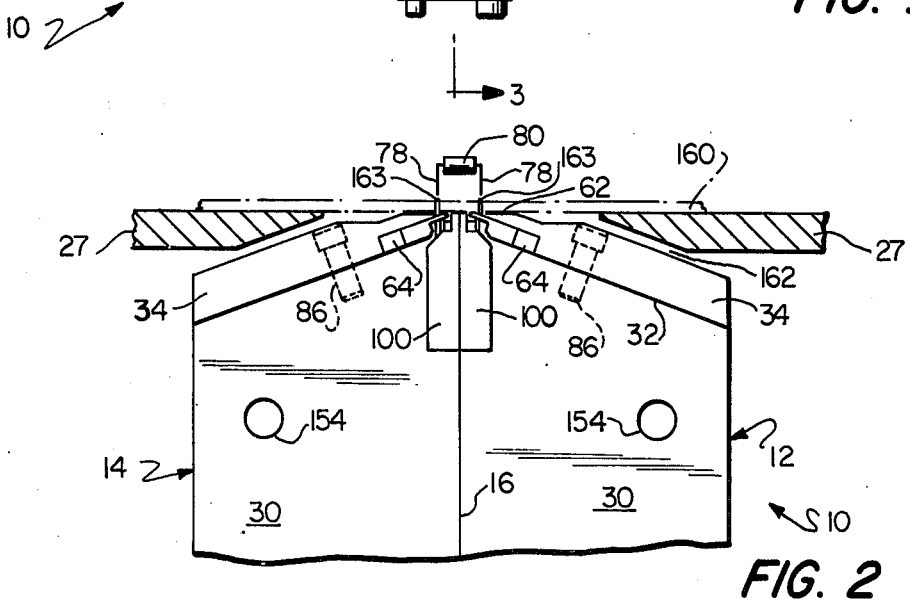
FIG. 2 is a partial front elevation view with parts omitted of the apparatus of FIG. 1.

As stated above the opposed cut and clinch modules 12, 14 are identical. The description which follows is made with reference to the right-hand module 12; it should be understood that the description, with allowance for otherhandedness, applies equally to the left-hand module 14. The module 12 includes a housing 30 having a sloping top surface 32 on which rests a cover 34 fixedly attached thereto by bolts 36 passing through holes 38. The cover 34 is generally in the form of a shallow channel (FIG. 6b) and the lower surfaces 40 of the channel legs 42 abut the sloping top surface 32 of the module housing 30. Locating pins 44 extending from the lower surfaces 40 of the cover 34 engage locating holes 46 (FIG. 11) in the sloping module surface 32 and provide precision alignment between the cover 34 and the housing 30. The central portion or web 48 of the cover 34 extends at its forward end beyond the legs 42 in a projection 50 having a lower surface 52 paralleling the lower surface 40 of the legs 42. The upper surface 54 of the projection 50 tapers down, not quite to a feather edge, leaving a narrow, blunt, flat edge 56. The angle 58 of the taper equals the angle 60 of the slope of the housing's top surface 32. Accordingly, when the cover 34 is attached to housing 30, the upper flat surface 62 of the cover projection 50 is horizontal and parallel to the work surface 27 (FIG. 2).

Figure 7C:
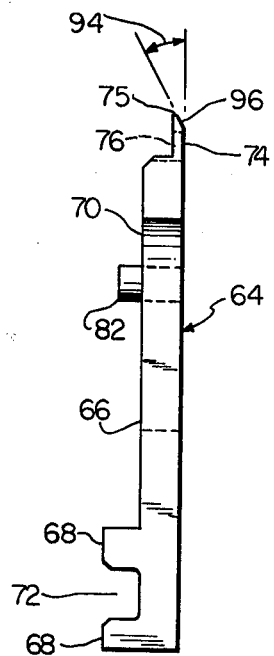

With the cover 34 affixed to the housing 30, a rectangular tunnel is provided, bound by the sloped housing surface 32 and the lower surface 52 and legs 42 of the cover 34. The cutter 64 rests upon the sloped surface 32 and fits slidingly within the rectangular tunnel. The cutter 64 includes a generally flat plate 66 having at one end a pair of transverse flanges 68 extending perpendicularly from the bottom surface 70. The flanges 68 are spaced apart to leave a channel 72 therebetween. At the opposed end of the flat plate 66 is located the cutting edge 74 having a row of slots 76 of equal size and shape. The row of slots 76 is parallel to the channel 72 and the slots 76 are generally oval in shape and extend through the cutting edge 74. The slots 76 are dimensioned and spaced apart so that a row of leads 78 of a DIP component 80 will fit in the slots 76 with adjacent leads 78 fitting through adjacent slots 76 as explained more fully hereinafter. As best seen in FIG. 7c the cutting edge 74 terminates in the thin slotted extension which tapers to a sharp-edged, blunt, flat surface 75. The angle 94 of taper equals the slope angle 60 of the surface 32 such that the cutter 64 presents a small flat surface 96 parallel to the work surface 27.

A pair of guide pins 82 extend from the lower surface 70 of the plate 66, and when the cutter 64 is slidingly fitted to the housing 30, the guide pins 82 register with and slide within the grooves 84 provided in the upper sloped surface 32 of the housing 30 FIG. 11). Additionally, a socket head cap screw 86 passes through the hole 88 in the cover 34, through the oval slot 90 in the cutter 64, and engages a threaded opening 92 centered in the sloped surface 32 of the housing 30. A fine surfaced spacer 98 encircles the body of the cap screw 86 and fits slidingly within the oval slot 90. Accordingly, it can be seen that the cutter 64 may slide in translation up and down along the sloped surface 32 of the housing 30 but is constrained from motion in all other directions.

Figure 3:
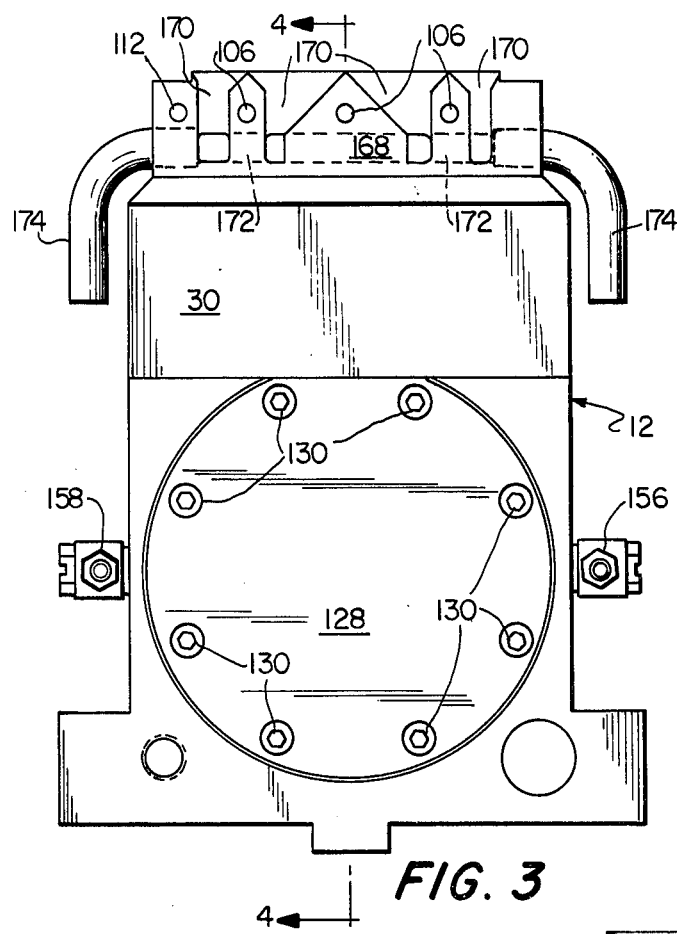
FIG. 3 is a front elevation view of a module taken along the line 3—3 of FIG. 1 but with anvil, cutter and cover removed.

The anvil 100 rests on the housing flange 102 and is fastened to the housing by three bolts (not shown) which pass through the holes 104 in the anvil 100 and engage the threaded holes 106 in the housing 30 (FIGS. 3, 8). A guide pin 108, integral with the anvil 100, extends from the inner surface 110 and engages in the guide hole 112 on the housing 30. The outer surface 114 of the anvil 100 is flush with the housing surface and forms a portion of the interface plane 16 between the left and right-hand cut and clinch modules 12, 14.

The anvil width 116 at its upper surface 117 is coextensive with the width 118 of the cutting edge 74. The upper inside portion of the anvil 100 is cut back from the surface 110 and an elongated rectangular insert 120 of hardened material, e.g. carbide, is affixed to the anvil 100. The insert 120 extends the full width 116 of the anvil 100 and the vertical flat surfaces of the insert 120 are parallel to outer surface 114 of the anvil 100 thereby providing a sharp protruding edge 122 which is used in shearing the leads 78 of DIP components 80 as disclosed hereinafter. In an embodiment which performed satisfactorily an insert 120 made of carbide was silver soldered to a steel anvil 100.

A cylindrical chamber 124 is included within the module housing 30, sealed with a gasket 126 and the cap 128 held in position by a circle of bolts 130. The outer surface of the cap 128 lies substantially in the interface plane 16. A circular hole 132 enters the housing 30 and is concentric with the chamber 124. A circular piston 134 having a concentric circular shaft 136 extended from one piston surface fits slidingly within the chamber 124 with the extended shaft 136 sliding in the housing hole 132. 'O' ring seals 139 on the piston 134 and shaft 136 recessed in grooves 140, prevent leakage from the chamber 124. A circular boss 142 on the piston 134 (FIG. 12) provides a chamber 144 between the cap 128 and the piston 134 even when the boss 142 abuts the cap 128.

An elongated lever 146 extends between the cutter 64 and the extended piston shaft 136. The lower end 148 of the lever 146 rides slidingly and pivotably within a rectangular opening 150 passing through the extended piston shaft 136. The upper end 152 of the lever 146 rides within the channel 72 formed by the flanges 68 of the cutter 64, and the lever 146 pivots about the dowel pin 154 which is integrally attached to the housing 30.

It should be noted that the lever 146 is not pinned directly to either the piston shaft 136 or the cutter 64. Thereby, without bending stresses, both the cutter 64 and piston 134 move with pure linear motion within the constraints of the cover 34 and the hole 132 respectively.

Gas under pressure from a pressure source (not shown) may be admitted to or released from the cylindrical chamber 124 via the fitting 156 and similarly the forward chamber 144 may be pressurized or depressurized via the fitting 158, all in a known manner. When the forward chamber 144 is pressurized and chamber 124 is depressurized the piston 134 slides to the right, as seen in FIG. 4, pivoting the lever 146 about the dowel pin 154 and driving the cutter 64 upward and leftward toward the anvil 100. When the gas pressure is released from the forward chamber 144, and the chamber 124 is pressurized, the piston 134 returns to its original position, at the left in FIG. 4, and the cutter 64 is withdrawn from the anvil 100.

FIG. 2 illustrates a pair of opposed modules 12, 14, abutting along a common interface plane 16 as described above and positioned in relation to a work surface 27. A predrilled printed circuit board 160 is held (by means not shown) over a beveled opening 162 in the work surface 27 such that a DIP component 80 is symetrically aligned to the common plane 16 with the rows of leads 78 extending downward for insertion on the circuit board 160. The cut and clinch apparatus 10 is shown, FIG. 2, in an elevated position with the flat top surface 62 of the cover 34 parallel with and supporting the lower surface of the printed circuit board 160. In operation, the printed circuit board 160 is located over the cut and clinch apparatus 10 by an X-Y positioner (not shown) or manually such that the predrilled holes 161 for the rows of leads 78 align with the openings in the cut and clinch modules 12, 14. In an automatic machine, the cut and clinch apparatus 10 rises beneath the circuit board 160 simultaneously as the component leads 78 are inserted in the holes. In manual operation the cut and clinch apparatus 10 may be raised prior to insertion of component leads 78 in order to support the printed circuit board 160 during insertion. Guide pins 163 rising vertically from the upper surfaces 62 of the covers 34 index in the predrilled holes 161 of the circuit board 160 and assure precise relative positioning between the circuit board 160 and the cut and clinch modules 12, 14. As stated above the positioning assembly 18 raises, lowers and for some applications angularly orients the cut and clinch apparatus 10. The positioning assembly 18 is not a novel part of this invention; as such no further detailed description is warranted here. Suffice it to say that actuation of pistons, solenoid plungers, and the like, can be applied in known ways to achieve the desired positioning motions. Application for U.S. Patent, Ser. No. 773,347 filed Mar. 1, 1977, is an example giving full details of a structure for raising, lowering and orienting a cut and clinch mechanism.

Figure 10A:
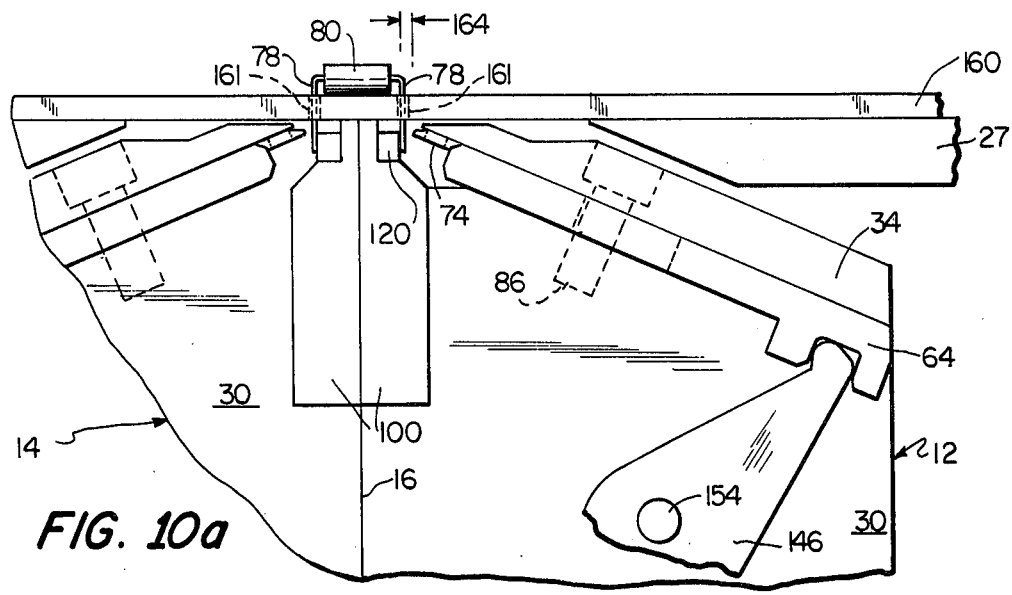

Operation of the apparatus 10 of this invention for cutting component leads 78 and providing an inward clinch is now described with particular reference to FIGS. 2, 4, and 10. In FIG. 10a, the cutter 64 is in the withdrawn position with chamber 124 pressurized (FIG. 4). In this position a space 164 exists between the cutters extreme cutting edge 74, with its narrow flat end surface 75, (FIG. 7) and the hardened insert 120. Into this space 164 between the insert 120 and the cutter 64, the leads 78 of the DIP component 80 enter when the component 80 is pressed against the printed circuit board 160. It is indicated, for example, in FIGS. 2 and 10a that one row of leads 78 enters into the right hand module 12 while the other row of leads 78 enters into a similar space in the left-hand module 14. The leads 78 extend below the upper horizontal surface of the hardened insert 120. Operation is described hereinafter for the right module 12; as stated above the opposed module 14 simultaneously performs similar although opposite-hand actions.

Figure 10B:
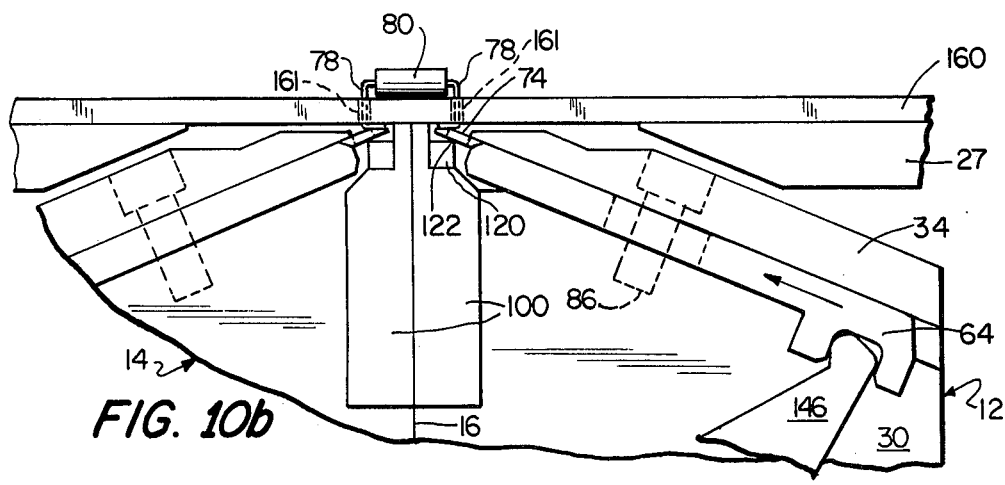
Figure 10C:
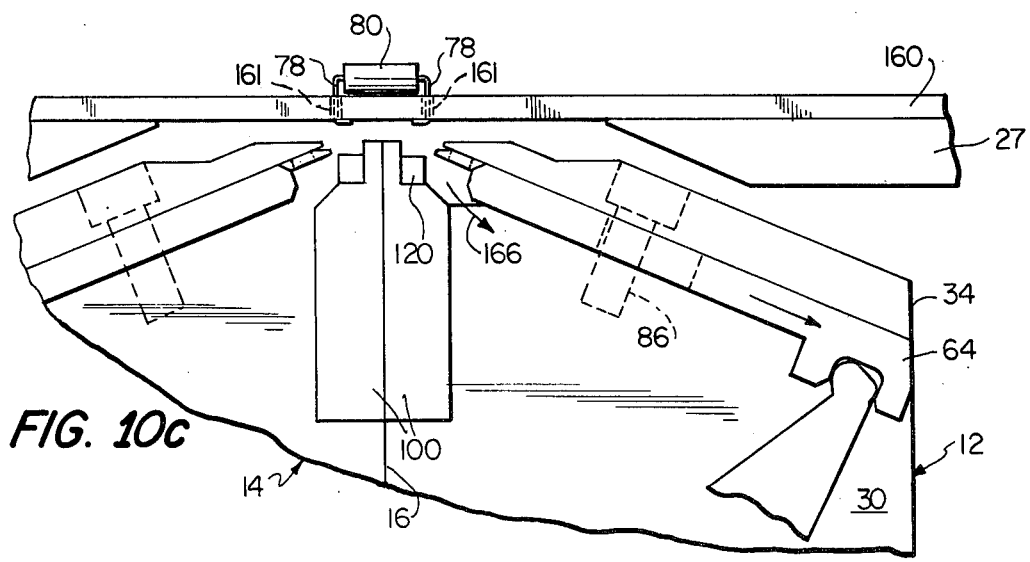

When gas pressure is applied to the chamber 144, driving the piston 134 away from the cylinder cap 128, to the right in FIG. 4, the lever 146 pivoting about the dowel pin 154 simultaneously drives the cutter 64, sliding the cutter 64 upward and to the left (FIGS. 4, 10b). During the sliding process, the flat blunt surface 75 (FIG. 7) of the cutting edge 74 impacts with the leads 78 and shears them against the protruding sharp edge 122 of the insert 120. Motion of the cutter 64 continues until the cutting edge 74 contacts the anvil 100; in the process the sheared leads are bent inward toward the interface plane 16. The cut and clinch apparatus 10 is then lowered by the positioning module 18. Finally, the gas pressure is released from the chamber 144 and applied to the chamber 124, driving the piston 134, lever 146 and cutter 64 back to their original conditions (FIGS. 4, 10c), leaving the component 80 firmly positioned on the circuit board 160 by virtue of the rows of leads 78 which now are clinched inwardly toward each other and against the lower surface of the circuit board 160.

It should be noted (FIG. 10c) that the sheared-off lead stubs fall away, as indicated by the arrow 166, from the cutter 64 and anvil 100 after the cutter 64 is withdrawn. To facilitate the removal of said lead stubs, the face 168 of the housing 30, adjacent to the anvil 100, (FIGS. 3, 4) includes recessed channels 170 into which the lead stubs enter. Ducts 172 connect between the channels 170. A vacuum from a vacuum source (not shown) is applied to the channels 170 and ducts 172 via the vacuum tubes 174 whereby the stubs are drawn away from the cutting edges in order to prevent clogging or improper cutting and clinching of subsequent DIP components.

Figure 9A:
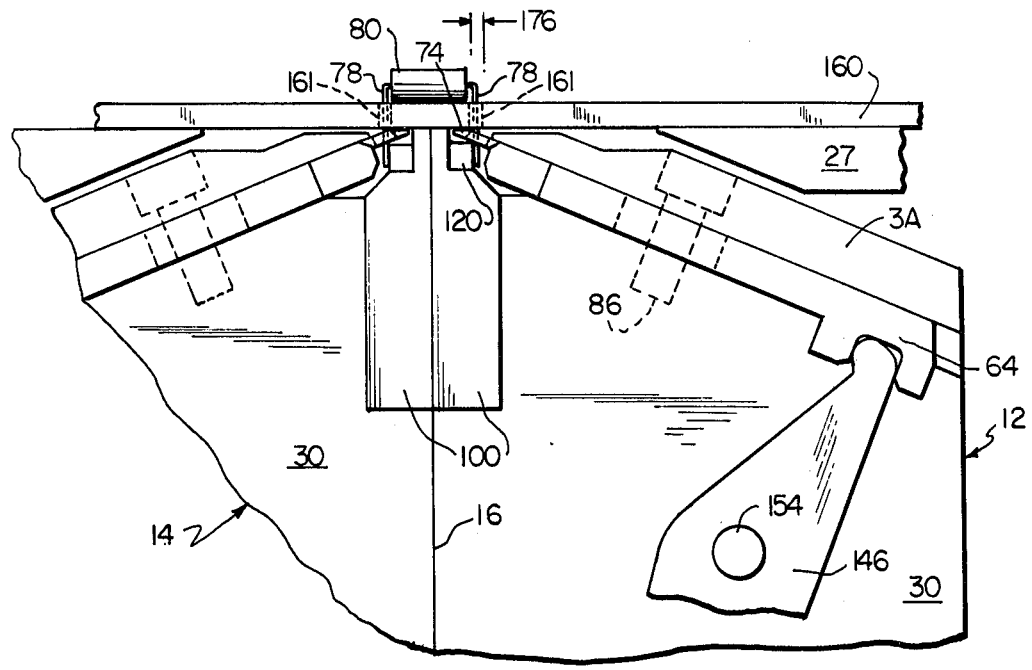

Operation of the apparatus 10 of this invention for cutting component leads and providing an outward clinch is now described with particular reference to FIGS. 2, 4, 9. In FIG. 9a, the cutter 64 is in the advanced position, with the cutting edge 74, adjacent to the anvil 100 with chamber 144 pressurized, and chamber 124 unpressurized. In this position the slots 76 in the cutting edge 74 of the cutter 64 align with the space 176 between the hardened insert 20 and the blunt cover edge 56 (FIGS. 6 and 7). Into this space 176, the leads 78 of the DIP component 80 enter when the component 80 is pressed against the printed circuit board 160. The leads 78 extending through the circuit board 160 enter and pass through the slots 76 in the cutting edge 74, like thread through the eye of a needle, one lead 78 in each slot 76. It is indicated, for example in FIG. 2 and 9a, that one row of leads 78 enters into the right-hand module 12, while the other row of leads 78 enters into a similar space in the left-hand module 14. As described above, the leads 78 extend below the upper horizontal surface of the hardened insert 120. Operation is described hereinafter for the right module 12; as stated above the opposed module 14 simultaneously performs similar although opposite-hand actions.

Figure 9B:
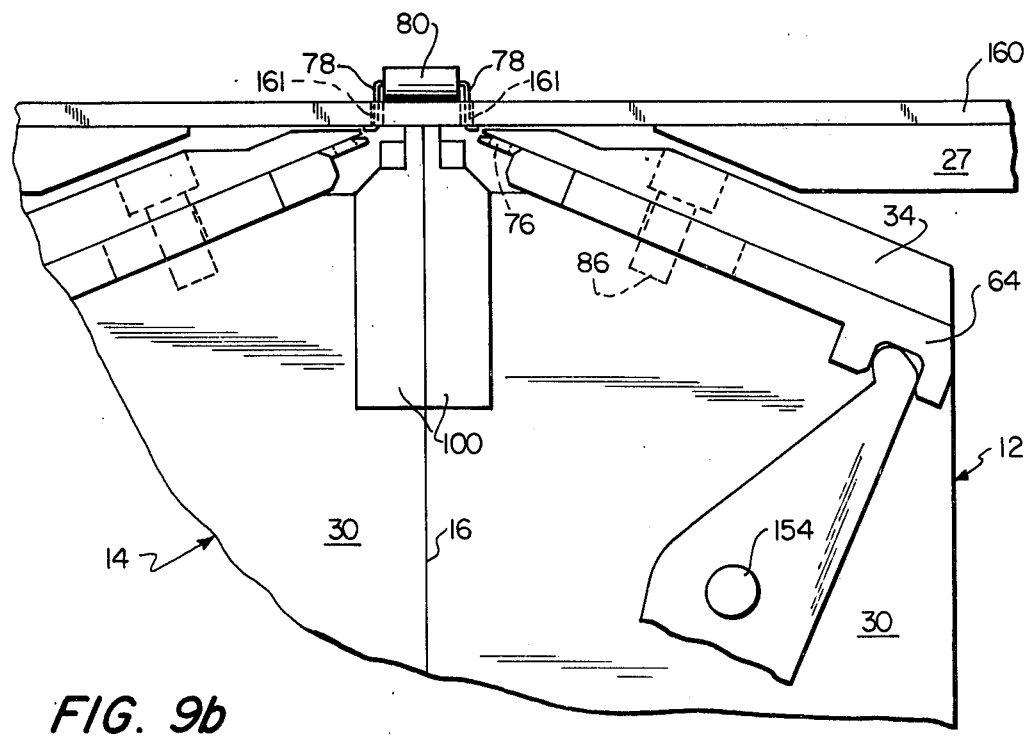

When gas pressure is applied to the chamber 124, driving the piston 134 toward the cylinder cap 128, to the left in FIG. 4, the lever 146 pivoting about the dowel pin 154 simultaneously drives the cutter 64. The cutter 64 slides downward and to the right (FIGS. 4, 9b). During the sliding process of the cutter 64, the leads 78 inserted through the slots 76 (FIG. 7) are bent outward and sheared against the blunt leading edge 56 (FIG. 6) of the cover 34. Motion of the cutter 64 continues until the sheared leads are pressed against the underside of the circuit board 160. The cut and clinch apparatus 10 is then lowered by the positioning module 18. Finally, the gas pressure is released from the chamber 124 and applied to the chamber 144, driving the piston 134, lever 146 and cutter 64 back to their original condition (FIG. 9a), leaving the component 80 firmly positioned on the circuit board 160 by virtue of the rows of leads 78 which now are clinched outwardly away from each other and against the lower surface of the circuit board 160.

As described above, the sheared-off lead stubs are drawn away into the channels 170 and ducts 172 via the vacuum tubes 174. Thus the apparatus 10 is kept clear and ready for continued usage.

Accordingly, it is shown that depending upon the initial position of the cutter 64, it is possible to cut and clinch leads 78 either inwardly or outwardly without modification to the cut and clinch apparatus 10 of this invention. The selection of inward or outward clinching can be made by the operator of a manual machine, or it is preprogrammed into an automatically controlled machine. The number of leads which may be simultaneously cut and clinched is generally dependent on the width of the cutter 64. The apparatus 10 described above has satisfactorily operated on DIP components having forty leads in parallel rows of twenty leads.

From the preceding description, it is evident that the objects of the invention are attained. Although the invention has been described and illustrated in detail, it is to be clearly understood that the description is by way of illustration and example only and is not to be taken by way of limitation. The spirit and scope of this invention are limited only by the terms of the appended claims.

For example, in an alternative embodiment of this invention, the piston 134 and cylinder chambers 124, 144 may be replaced by any suitable actuator, for example a solenoid operated shaft, which drives the lever 146.

In another embodiment of this invention, the cut and clinch modules 12, 14 do not abut along the interface plane 16 but are set off equal distances from said central plane 16. Thus DIP components 80 having various spacings between the rows of leads 78 may be cut and clinched without modification per se of the basic modules 12, 14.

In still another embodiment of this invention ball or roller bearings are positioned under the bottom surface 70 of the cutter 64 to facilitate sliding of the cutter 64. The bearings are recessed in the grooves 84 in the sloped housing surface 32 (FIG. 11).

In yet another embodiment of this invention portions of the cutting edge 74 of the cutter 64 are notched back to open the forward boundary of selected slots 76, whereby selected leads 78 on the DIP component 80 are neither cut nor clinched upon actuation of the cutter 64.

What is claimed:

1. A first apparatus for simultaneously cutting and clinching a row of aligned leads of a DIP type electronic component, said leads inserted in and projecting beneath a circuit board, said apparatus including:
   a housing;
   a cutter, said cutter mounted for translating on a first surface of said housing, said cutter having an aligned row of spaced slots therethrough, said row of slots being aligned transversely to the direction of said translation, said slots spaced apart to receive therein said projecting component leads;
   a cover fixedly attached to said housing and adjacent said cutter with sliding contact therebetween, said cover including a first cutting edge adjacent said cutter, said first cutting edge sliding across said row of slots when said cutter is translated; and
   means to translate said cutter, whereby said component leads projecting beneath said circuit board and received in said slots are cut against said first cutting edge and clinched when said cutter is translated.

2. The first apparatus of claim 1 further including:
   a second cutting edge, said second cutting edge located on said cutter;
   an anvil mounted on said housing, said anvil having a shearing surface spaced apart from said second cutting edge and said cover, said second cutting edge moving across said shearing surface when said cutter translates;
   whereby said component leads projecting beneath said circuit board and received between said shearing surface and said second cutting edge are cut against said shearing surface and clinched when said cutter is translated.

3. The first apparatus of claim 2 wherein said shearing surface is hardened.

4. The first apparatus of claim 2 wherein said means to translate said cutter include a double acting piston connected to said cutter by a pivoting lever.

5. The first apparatus of claim 2 further including vacuum means proximate said cutting edges, whereby the cut-off stubs of said leads are drawn away after cutting.

6. The first apparatus of claim 2 further including a second similar apparatus comprising housing, cutter, cover, anvil and translating means, said second apparatus mounted opposedly facing said first apparatus with said cutting edges and row of slots of said first apparatus being parallel to the cutting edges and row of slots of said second apparatus, whereby two parallel rows of aligned leads of said DIP component are simultaneously cut and clinched.

7. The first apparatus of claim 2 further including means to vertically raise and lower said housing, and means to angularly orient said housing.

* * * * *